US010438956B2

(12) United States Patent
Balakrishnan et al.

(10) Patent No.: US 10,438,956 B2
(45) Date of Patent: Oct. 8, 2019

(54) HIGH DENSITY PROGRAMMABLE E-FUSE CO-INTEGRATED WITH VERTICAL FETS

(71) Applicant: INTERNATIONAL BUSINESS MACHINES CORPORATION, Armonk, NY (US)

(72) Inventors: Karthik Balakrishnan, White Plains, NY (US); Michael A. Guillorn, Cold Springs, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/615,248

(22) Filed: Jun. 6, 2017

(65) Prior Publication Data

US 2017/0345829 A1    Nov. 30, 2017

Related U.S. Application Data

(62) Division of application No. 15/164,420, filed on May 25, 2016, now Pat. No. 9,728,542.

(51) Int. Cl.
  *H01L 23/525* (2006.01)
  *H01L 29/772* (2006.01)
  (Continued)

(52) U.S. Cl.
  CPC .. *H01L 27/11206* (2013.01); *H01L 21/76224* (2013.01); *H01L 23/5256* (2013.01);
  (Continued)

(58) Field of Classification Search
  CPC ......... H01L 27/11206; H01L 21/76224; H01L 21/76805; H01L 21/76895; H01L 23/5256;
  (Continued)

(56) References Cited

U.S. PATENT DOCUMENTS 7,645,645 B2 * 1/2010 Hovis ................. H01L 23/5256
                                                      257/209
8,035,191 B2 * 10/2011 Lin ..................... H01L 23/5256
                                                      257/529

(Continued)

OTHER PUBLICATIONS

List of IBM Patents or Patent Applications Treated as Related dated Jun. 6, 2017, 2 pages.

*Primary Examiner* — Eric A. Ward
(74) *Attorney, Agent, or Firm* — Tutunjian & Bitetto, P.C.; Erik Johnson

(57) ABSTRACT

A method for integrating vertical transistors and electric fuses includes forming fins through a dielectric layer and a dummy gate stack on a substrate; thinning top portions of the fins by an etch process; epitaxially growing top source/drain regions on the thinned portions of the fins in a transistor region and top cathode/anode regions on the thinned portions of the fins in a fuse region; and removing the dummy gate layer and exposing sidewalls of the fins. The fuse region is blocked to form a gate structure in the transistor region. The transistor region is blocked and the fuse region is exposed to conformally deposit a metal on exposed sidewalls of the fins. The metal is annealed to form silicided fins. Portions of the substrate are separated to form bottom source/drain regions for vertical transistors in the transistor region and bottom cathode/anode regions for fuses in the fuse region.

8 Claims, 10 Drawing Sheets

(51) Int. Cl.
*H01L 27/112* (2006.01)
*H01L 29/423* (2006.01)
*H01L 29/786* (2006.01)
*H01L 29/66* (2006.01)
*H01L 29/06* (2006.01)
*H01L 21/762* (2006.01)
*H01L 27/06* (2006.01)
*H01L 21/84* (2006.01)

(52) U.S. Cl.
CPC .... *H01L 29/0653* (2013.01); *H01L 29/42392* (2013.01); *H01L 29/66545* (2013.01); *H01L 29/66666* (2013.01); *H01L 29/66742* (2013.01); *H01L 29/78642* (2013.01); *H01L 29/78696* (2013.01); *H01L 21/84* (2013.01); *H01L 27/0629* (2013.01)

(58) Field of Classification Search
CPC ....... H01L 23/535; H01L 23/525–5258; H01L 28/20–26; H01L 29/0653; H01L 29/42392; H01L 29/66545; H01L 29/66666; H01L 29/7827; H01L 29/7828; H01L 29/78642; H01L 29/78696; H01L 29/66795–66818; H01L 29/785–7856; H01L 21/823431; H01L 21/823821; H01L 2029/7857; H01L 2029/7858; H01L 27/0886

See application file for complete search history.

(56) References Cited

U.S. PATENT DOCUMENTS

| | | | |
|---|---|---|---|
| 8,211,772 B2* | 7/2012 | Kavalieros | H01L 29/66795 257/E21.409 |
| 8,274,110 B2* | 9/2012 | Sandhu | H01L 27/2463 257/329 |
| 2014/0106523 A1* | 4/2014 | Koldiaev | H01L 21/845 438/212 |
| 2014/0197457 A1* | 7/2014 | Wang | H01L 29/785 257/192 |
| 2014/0353796 A1* | 12/2014 | Lavoie | H01L 28/00 257/529 |
| 2016/0211369 A1* | 7/2016 | Jan | H01L 27/12 |

* cited by examiner

HIGH DENSITY PROGRAMMABLE E-FUSE CO-INTEGRATED WITH VERTICAL FETS

BACKGROUND

Technical Field

The present invention generally relates to semiconductor processing and devices, and more particularly, to electrical fuses (e-fuses) disposed vertically and co-integrated with field effect transistors (FETs).

Description of the Related Art

Programmable electrical fuses (e-fuses) provide a plurality of functions on semiconductor devices. These functions may include uses for applications such as memory array redundancy, post-manufacture programming of circuits, and package identification coding. Despite their usefulness, e-fuses can consume valuable chip space.

SUMMARY

In accordance with an embodiment of the present principles, a method for integrating vertical transistor and vertical electric fuses includes forming fins through a dielectric layer and a dummy gate stack on a substrate, the dummy gate stack including a bottom spacer, a dummy gate layer and a top spacer layer; thinning top portions of the fins by an etch process; epitaxially growing top source/drain regions on thinned portions of the fins in a transistor region and top cathode/anode regions on the thinned portions of the fins in a fuse region; removing the dummy gate layer and exposing sidewalls of the fins. The fuse region is blocked to form a gate structure in the transistor region. Then, the transistor region is blocked, and the fuse region is exposed to conformally deposit a metal on exposed sidewalls of the fins in the fuse region. The metal is annealed to form silicided fins to form fuses in the fuse region. Portions of the substrate are separated to form bottom source/drain regions for vertical transistors in the transistor region and bottom cathode/anode regions for fuses in the fuse region.

Another method for integrating vertical transistor and vertical electric fuses includes forming fins through a dielectric layer and a dummy gate stack on a substrate, the dummy gate stack including a bottom spacer, a dummy gate layer and a top spacer layer; recessing the fins down into the dielectric layer; filling recesses above the fins with a dielectric fill; removing the dielectric layer; thinning top portions of the fins by an etch process; epitaxially growing top source/drain regions on thinned portions of the fins in a transistor region and top cathode/anode regions on the thinned portions of the fins in a fuse region; encapsulating the source/drain regions and cathode/anode regions with a dielectric cap down to the top spacer layer; etching with the dielectric caps as an etch mask to expose the bottom spacer layer; removing the dummy gate layer and exposing sidewalls of the fins; blocking the fuse region to form a gate structure in the transistor region; blocking the transistor region and exposing the fuse region; conformally depositing a metal on exposed sidewalls of the fins in the fuse region; annealing the metal to form silicided fins to fork fuses in the fuse region; and separating portions of the substrate to form bottom source/drain regions for vertical transistors in the transistor region and bottom cathode/anode regions for fuses in the fuse region.

A semiconductor device includes a doped portion of a substrate being separated by a shallow trench isolation region to form a bottom source/drain region in a transistor region and bottom cathode/anode region in a fuse region. A vertical transistor includes a first fin formed on the bottom source/drain region in the transistor region and forming a channel for the vertical transistor; a gate structure formed on an intermediary portion of the first fins in the transistor region; and a top source/drain region grown on a thinned portion of the first fin. An electrical fuse is co-integrated with the vertical transistor, and includes a silicided link formed from a second fin on the bottom cathode/anode region in the fuse region; and a top cathode/anode region coupled to the link in the fuse region.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
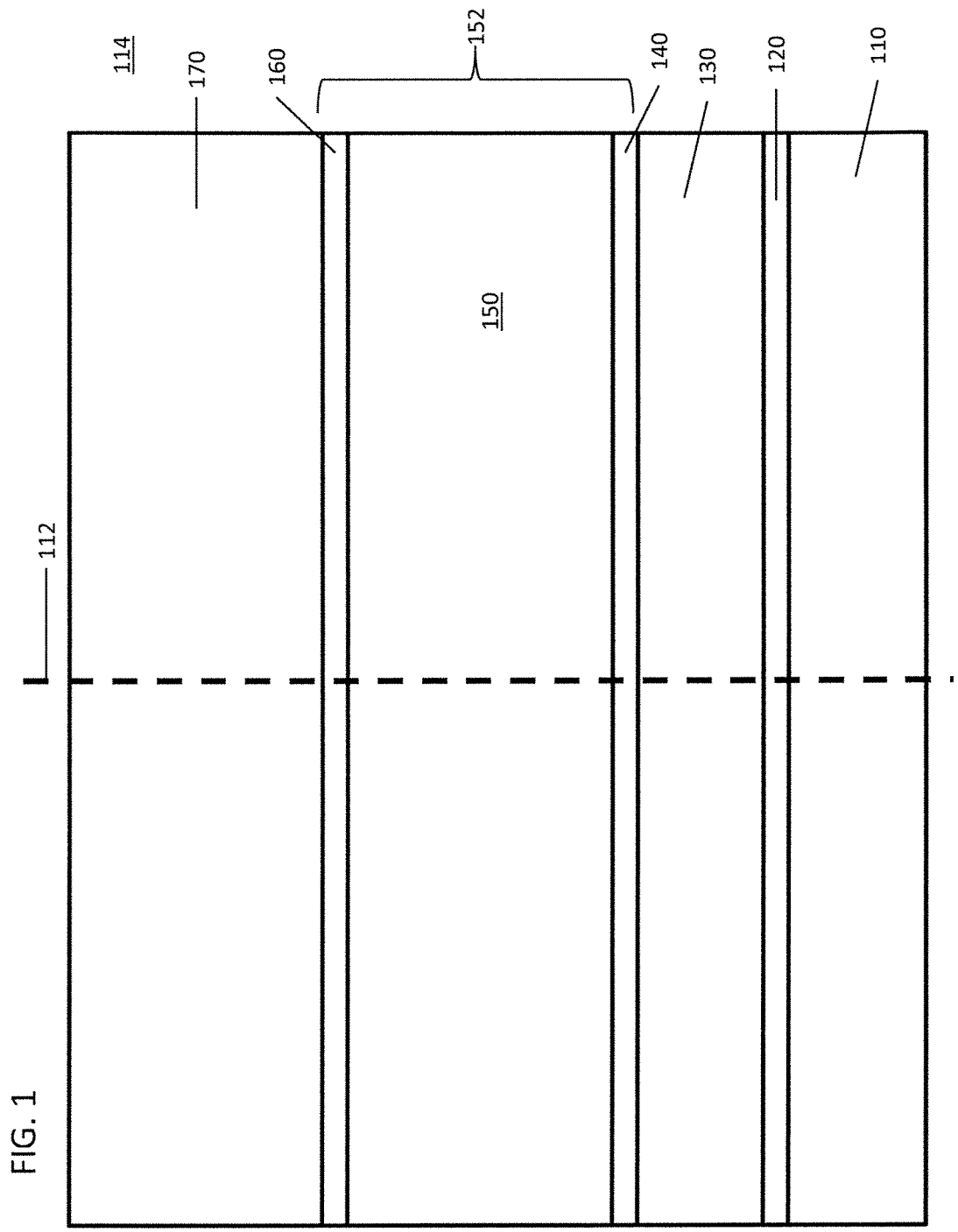
FIG. 1 is a cross-sectional view showing a dummy stack and dielectric layer formed on a substrate in accordance with the present principles.

In accordance with the present principles, co-integration of programmable electrical-fuse (e-fuse) devices with vertical field effect transistors (FET) is provided. Vertical transistors provide an option for scaling of node sizes (e.g., for 5 nm technology and beyond). A channel-last replacement metal-gate gate all-around vertical transistor programmable e-fuse device is obtained by siliciding inside a channel trench and then contacting a cathode (bottom) and anode (top). A narrow channel serves as a fuse link, whose length can be equivalent to a channel length of any fabricated vertical transistors.

The channel-last fabrication approach forms vertical field effect transistors (VFETs), or more specifically, vertical finFETs, where current flows vertically through the channel, and vertical e-fuses on the same substrate. The vertical finFETs and vertical e-fuses may be epitaxially grown on a coterminous region of a substrate surface implementing various fabrication processes.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such h as "beneath," "below," "above," "upper," and the like, may be used herein for ease of description to describe one element's or feature's relationship to another element(s) or feature(s) as illustrated in the FIGs. It will be understood that the spatially relative terms are intended to encompass different orientations of the device in use or operation in addition to the orientation depicted in the FIGs. For example if the device in the FIGs. is turned over elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

While exemplary embodiments have been shown for a particular device, it should be understood that a plurality of such devices may be arranged and/or fabricated on a substrate to form integrated devices that may be integrated onto a substrate, for example through very large scale integration to produce complex devices such a central processing units (CPUs) and application specific integrated circuits (ASICs). The present embodiments may be part of a device or circuit, and the circuits as described herein may be part of a design for an integrated circuit chip.

Referring now to the drawings in which like numerals represent the same or similar elements and initially to FIG. 1, a cross-sectional side view of a substrate or device 114 is shown in accordance with an exemplary embodiment. In one or more embodiments, a substrate 110 may be a semiconductor. The substrate may be crystalline. The substrate may be essentially (i.e., except for contaminants) a single element (e.g., silicon), primarily of a single element (i.e., with doping), for example, silicon (Si) or germanium (Ge), or the substrate may be a compound semiconductor, for example, a III-V compound semiconductor (e.g., GaAs), SiC, or SiGe. The substrate may also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). In one or more embodiments, the substrate 110 may be a silicon wafer. In various embodiments, the substrate is a single crystal silicon wafer. A single crystal silicon substrate may have a <100> or a <111> surface, which may be used for epitaxial growth of a FET channel and/or an e-fuse.

In one or more embodiments, a counter-doped layer 120 may be formed on or within the substrate 110, where the counter-doped layer 120 may be used to electrically isolate a source/drain region (130) from the bulk of the substrate 110. The counter-doped layer 120 may be n-doped or p-doped.

In one or more embodiments, a heavily doped layer 130 may be formed on the counter-doped layer 120. The heavily doped layer 130 may be n-doped or p-doped. The heavily doped layer 130 may have a dopant concentration in the range of about $1 \times 10^{19}$ to about $1 \times 10^{22}$ dopant atoms/cm$^3$. In various embodiments, the heavily doped layer 130 may form a source or a drain of a finFET, and/or an anode/cathode of an e-fuse. It should be noted that a source and a drain may be interchanged, where the drain may be in the substrate below a vertical fin and the source may be formed on the top of a vertical fin. An anode and cathode of e-fuse may be interchanged as well.

In one or more embodiments, the counter-doped layer 120 and the heavily doped layer 130 may each be in-situ doped during epitaxial growth on a single crystal substrate. In various embodiments, dopants may be ion implanted into the counter-doped layer 120 and/or the heavily doped layer 130. The counter-doped layer 120 may include dopants of an opposite type relative to the heavily doped layer 130.

A bottom spacer layer 140 may be formed on an exposed surface of the substrate heavily doped layer 130. The bottom spacer layer 140 may be a dielectric material, for example, silicon oxide (SiO), silicon nitride (SiN), or boron nitride (BN). The bottom spacer layer 140 may be deposited by chemical vapor deposition (CVD), physical layer deposition (PVD), atomic layer deposition (ALD), as well as modifications thereof, such as plasma enhanced (e.g., PECVD), metal organic (e.g., MOCVD), electron beam (e.g., EB-PVD), low pressure (e.g., LPCVD), etc., or combinations thereof. The bottom spacer layer 140 may act as an etch stop layer during fabrication processes.

In one or more embodiments, the bottom spacer layer 140 may have a thickness in the range of about 2 nm to about 10 nm, or in the range of about 2 nm to about 5 nm. The thickness of the bottom spacer layer 140 may define the distance of a bottom edge of a gate structure from the heavily doped layer 130.

In one or more embodiments, a dummy gate layer 150 may be formed on the bottom spacer layer 140, which may provide a sacrificial template for forming a vertical channel, a gate structure on a channel, and/or an e-fuse structure. In various embodiments, the dummy gate layer 150 may be amorphous silicon (a-Si) or polycrystalline silicon (p-Si).

In one or more embodiments, the dummy gate layer 150 may have a thickness in the range of about 10 nm to about 100 nm, or in the range of about 10 nm to about 50 nm, or in the range of about 10 nm to about 20 nm.

In one or more embodiments, a top spacer layer 160 may be formed on the dummy gate layer 150, where the top spacer layer 160 may be the same material as the bottom spacer layer 140. The top spacer layer 160 may be a dielectric material, for example, silicon oxide (SiO), silicon nitride (SiN), silicon oxynitride (SiON), or boron nitride (BN).

In one or more embodiments, the top spacer layer 160 may have a thickness in the range of about 2 nm to about 10 nm, or in the range of about 2 nm to about 5 nm. The top spacer layer 160 may have a different thickness than the bottom spacer layer 140.

The bottom spacer layer 140, dummy gate layer 150 and top spacer layer 160 may form a channel layer stack 152, where the channel layer stack 152 may provide a template for defining a vertical channel and/or forming a gate structure.

In one or more embodiments, a dielectric layer 170, e.g., an oxide layer, may be formed on the top spacer layer 160, where the layer 170 may be a sacrificial layer blanket deposited on the top spacer layer 160. The layer 170 may be silicon oxide (SiO), which may be formed by a CVD deposition or a PVD deposition. The oxide layer 170 may be a different material than the top spacer layer 160, such that the top spacer layer 160 may act as an etch stop layer. The device 114 may be divided into a transistor portion and a fuse portion by a dividing line 112.

Figure 2:
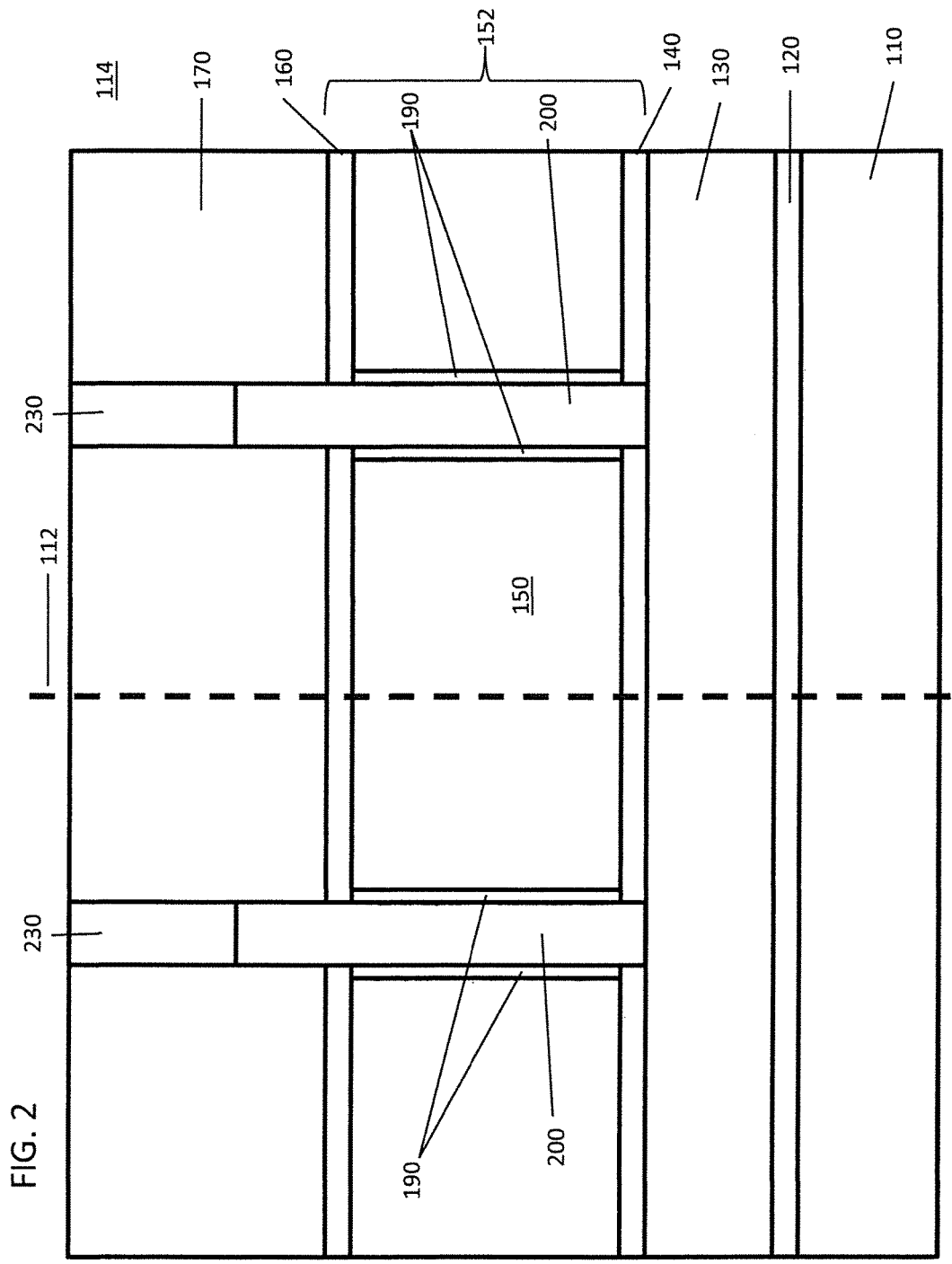
FIG. 2 is a cross-sectional view of the device in FIG. 1 showing fins formed in fin trenches and recessed to fill the recesses with a dielectric fill in accordance with the present principles.

Referring to FIG. 2, a cross-sectional view shows fin 200 formed through the dielectric layer 170, top spacer layer 160, dummy gate layer 150 and bottom spacer layer 140 to the surface of the heavily doped layer 130 in accordance with an exemplary embodiment. A photo mask layer (not shown) may be a temporary resist (e.g., PMMA) that may be deposited on the dielectric layer 170, patterned, and developed. The photo mask layer may be a positive resist or a negative resist. One or more openings may be patterned in the photo mask layer for forming one or more fin trenches down to the heavily doped layer 130. The size and placement of the openings in the photo mask layer may define the width, length, and pitch of the one or more openings, and thereby, the width, length, and pitch of the one or more vertical fins.

In one or more embodiments, one or more suitable etching processes may be utilized to remove material from the dielectric layer 170, top spacer layer 160, dummy gate layer 150, and bottom spacer layer 140, to form fin trenches, where the underlying material may act as an etch stop layer for each of the one or more etching processes sequentially utilized to form the fin trench(es). In various embodiments, the fin trenches may be etched using a directional reactive ion etching (RIE) process.

In one or more embodiments, after formation of the one or more fin trench(es), at least a portion of the channel layer stack 152 inside the one or more fin trenches may be oxidized to form a dummy layer liner 190. In various embodiments, the dielectric layer 170, top spacer layer 160, dummy gate layer 150, and bottom spacer layer 140 may be exposed to oxidation, where the exposed portion of the dummy gate layer 150 inside the fin trench may be oxidized to form the dummy layer liner 190. The dummy layer liner 190 may surround the trench at the level of the dummy gate layer 150. The dummy layer liner 190 may protect the interface between the vertical fin 200 and the dummy gate layer 190 during epitaxial growth and/or subsequent processes, where the dummy layer liner 190 may avoid an amorphous crystal structure of the dummy gate layer 150 interfering with the epitaxial growth.

In various embodiments, the dummy layer liner 190 may be formed by plasma oxidation or thermal oxidation of the sidewalls of the dummy gate layer 150 within the fin trenches. In various embodiments, thermal oxidation may be done using an oxidizing gas (e.g., $O_2$, $O_3$, etc.) at temperatures in the range of about 600° C. to about 1200° C. The oxidation of the dummy gate layer material (e.g., a-Si) may form $SiO_2$.

Vertical fins 200 may be formed within each of the fin trenches. The vertical fins 200 may be formed by epitaxial growth from the exposed surface of the heavily doped layer 130. In various embodiments, the heavily doped layer 130 may have a <100> or <111> crystal orientation, and the vertical fins 200 may be formed with the same crystal orientation as the heavily doped layer 130. The heavily doped layer 130 may have the same crystal orientation as the bulk substrate or an active layer on the substrate. In various embodiments, the top surface of the vertical fins 200 may have a <100> crystal orientation. By forming the vertical fin(s) 200 on the heavily doped layer 130, the source-channel junction is self-aligned at the common interface.

The vertical fins 200 are formed on the heavily doped layer 130, where regions of the heavily doped layer 130 may act as a source or a drain for a VFET, and the vertical fins 200 act as a channel for the VFET.

In one or more embodiments, the vertical fins 200 may be silicon, (Si), germanium (Ge), silicon-germanium (SiGe), gallium arsenide (GaAs), indium gallium arsenide (InGaAs), indium arsenide (InAs), or indium aluminum arsenide (InAlAs). The vertical fins 200 may be single crystal epitaxially grown on the heavily doped layer 130. The vertical fins 200 may extend above the surface of the oxide layer 170 and expand laterally due to different growth rates of the different crystal faces. In particularly useful embodiments, Ge is included in the fins 200 to obtain electron and hole mobility benefits.

In one or more embodiments, the one or more vertical fins 200 may have a width in the range of about 6 nm to about 20 nm, or may have a width in the range of about 8 nm to about 15 nm, or may have a width in the range of about 10 nm to about 12 nm, and a height in the range of about 30 nm to about 300 nm, or about 50 nm to about 150 nm.

A fraction of the vertical fins 200 are recessed and removed from an upper portion of fin trench to form recess(es). In various embodiments, the height of the vertical fin 200 may be reduced, such that the top surface of the vertical fin 200 is below the top surface of the dielectric layer 170 but above the top surface of the top spacer layer 160. The fraction of a vertical fin 200 may be removed by a selective etch, where the selective etch may be a wet etch or a blanket RIE.

A dielectric fill 230 may be performed in the recesses formed in the trenches. The fill 230 may include nitride and more specifically silicon nitride. The fill 230 may extend above the top of the recesses and be planarized be a planarization process, e.g., chemical mechanical polishing (CMP).

Figure 3:
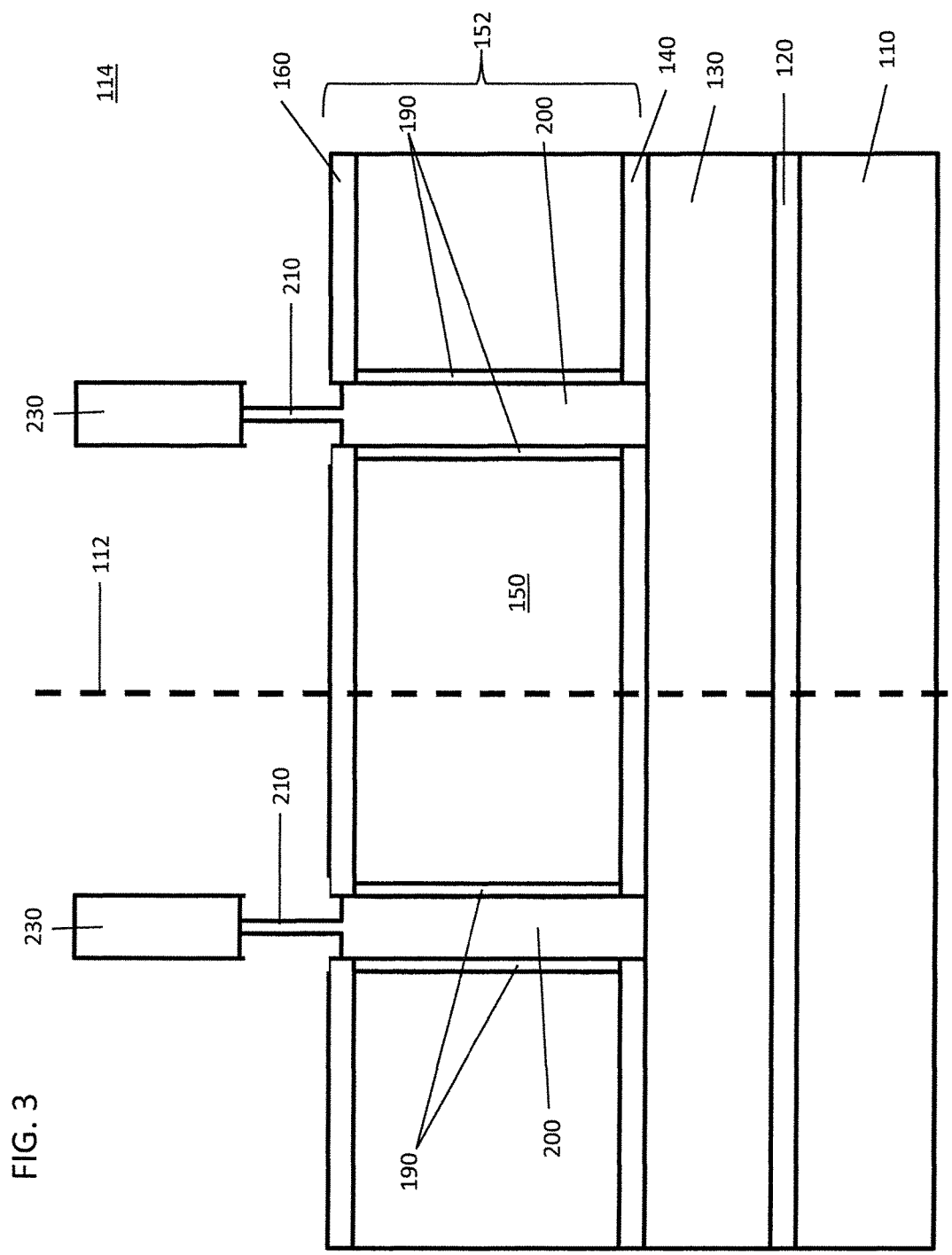
FIG. 3 is a cross-sectional view of the device in FIG. 2 showing the fins thinned by etching in accordance with the present principles.

Referring to FIG. 3, the dielectric layer 170 above the top spacer layer 160 may be selectively removed to expose at least an upper portion 210 of the vertical fin 200 and dielectric fill 230. In various embodiments, the dielectric layer 170 may be removed by a wet etch and/or a blanket RIE. The width of the upper portion 210 of the vertical fins 200, approximately between the fill 230 and the top spacer layer 160, may be reduced by selective etching of particular crystal faces of the vertical fins 200. At least an upper portion of the vertical fins 200 may thereby be thinned. In various embodiments, etching the sides of an upper portion 210 of a vertical fin 200 may also remove vertical fin material below the top surface of the top spacer layer 160. In one or more embodiments, the portion 210 of the vertical fins 200 may have a width in the range of about 2 nm to about 3 nm.

Figure 4:
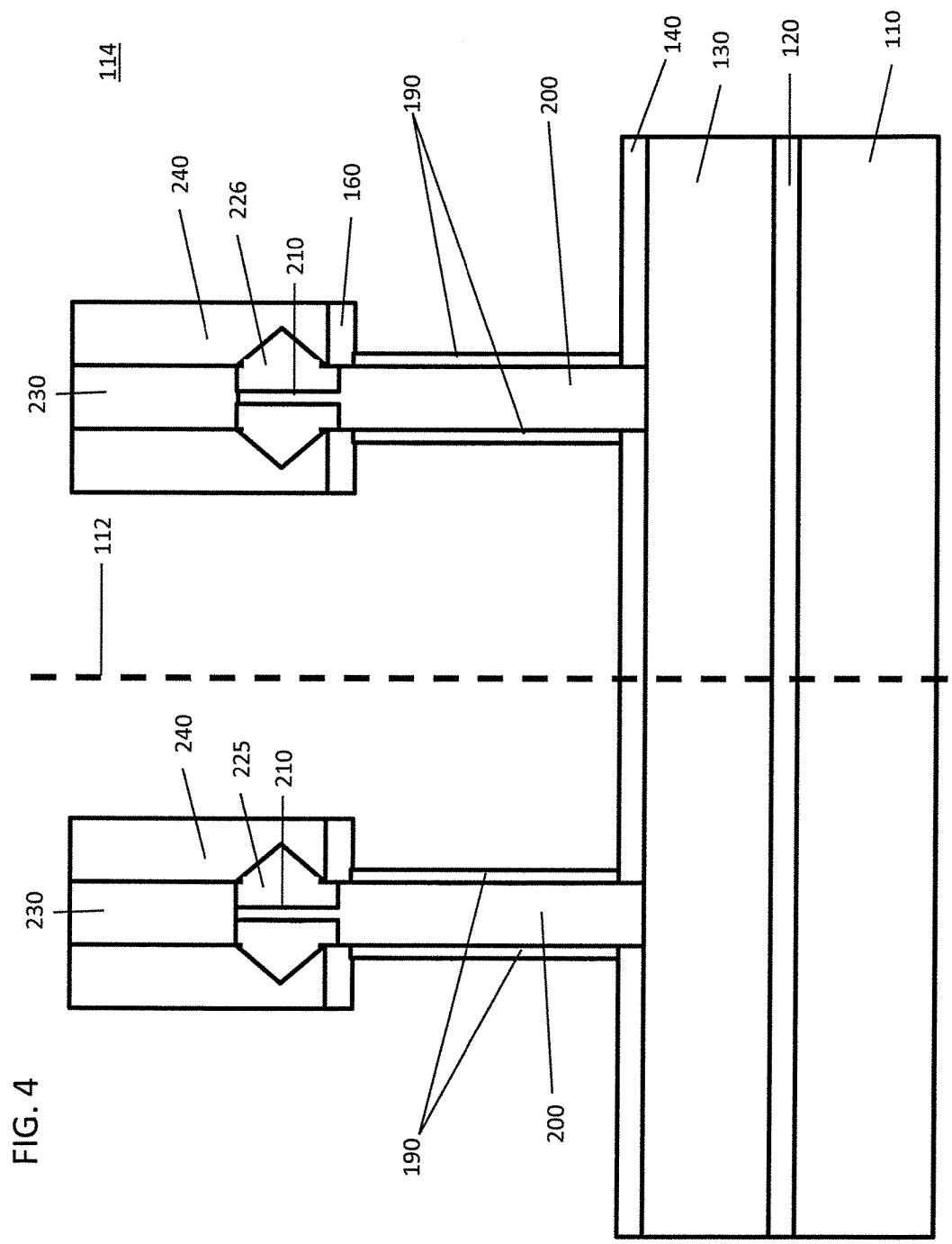
FIG. 4 is a cross-sectional view of the device in FIG. 3 showing source/drain regions and cathode/anode regions formed by epitaxial growth on the thinned portions of the fins in accordance with the present principles.

Referring to FIG. 4, a doped material forming a top source/drain 225 may be formed on the vertical fins 200. The top source/drain 225 may be formed by epitaxial growth on the exposed surface of the portion 210 of the vertical fins 200, such that the vertical fin 200 and the top source/drain 225 have the same crystal orientation. The top source/drain 225 may be n-doped or p-doped. The top source/drain may be doped in-situ during deposition of the top source/drain 225.

In one or more embodiments, a doped material forming a top anode/cathode 226 may be formed. The top anode/cathode 226 may be formed by epitaxial growth on the exposed surface of the portion 210, such that the top anode/cathode 226 has the same crystal orientation. The top anode/cathode 226 may be n-doped or p-doped. The top anode/cathode may be doped in-situ during deposition of the top anode/cathode 226.

In various embodiments, the locations of the source and drain of the vertical transistor may be reversed such that the drain is on the top of a vertical fin, while the source is at the bottom. The source may, therefore, be at the bottom or the top. In various embodiments, the locations of the cathode and anode of the e-fuse may be reversed such that the anode is on the top of the fin, while the cathode is at the bottom. The anode may, therefore, be at the bottom or the top.

The doped material for top source/drain 225 and top anode/cathode 226 is formed before removing dummy gate layer 150 and with top spacer layer 160 in place. A dielectric material 240 is formed over the fill 230 and top source/drain 225 and top anode/cathode 226. The dielectric material 240, for example, silicon oxide (e.g., $SiO_2$), may be formed on the top spacer layer 160 and cover the fill or caps 230 and the top source/drain 225 and top anode/cathode 226 on the vertical fins 200. The dielectric material 240 may be blanket deposited over the fill 230, the source/drains 225, and anode/cathodes 226. In various embodiments, the height of the dielectric material 240 may be reduced by chemical-mechanical polishing (CMP) and/or etching.

In one or more embodiments, the dielectric material 240 may be patterned and portions removed to expose portions of the underlying top spacer layer 160. The dielectric material 240 may act as a hardmask for removing portions of the top spacer layer 160 and the dummy gate layer 150. A portion of the top spacer layer 160 and a portion of the dummy gate layer 150 may be removed. The top spacer layer 160 and the dummy gate layer 150 may be removed by a directional RIE. Then, the remaining portion of the dummy gate layer 150 shadowed by the patterned dielectric material 240 and remaining portion of the top spacer layer 160 may be removed to expose the dummy layer liners 190 on the vertical fins 200. The remaining portion of the dummy gate layer 150 may be removed by a wet chemical etch.

Figure 5:
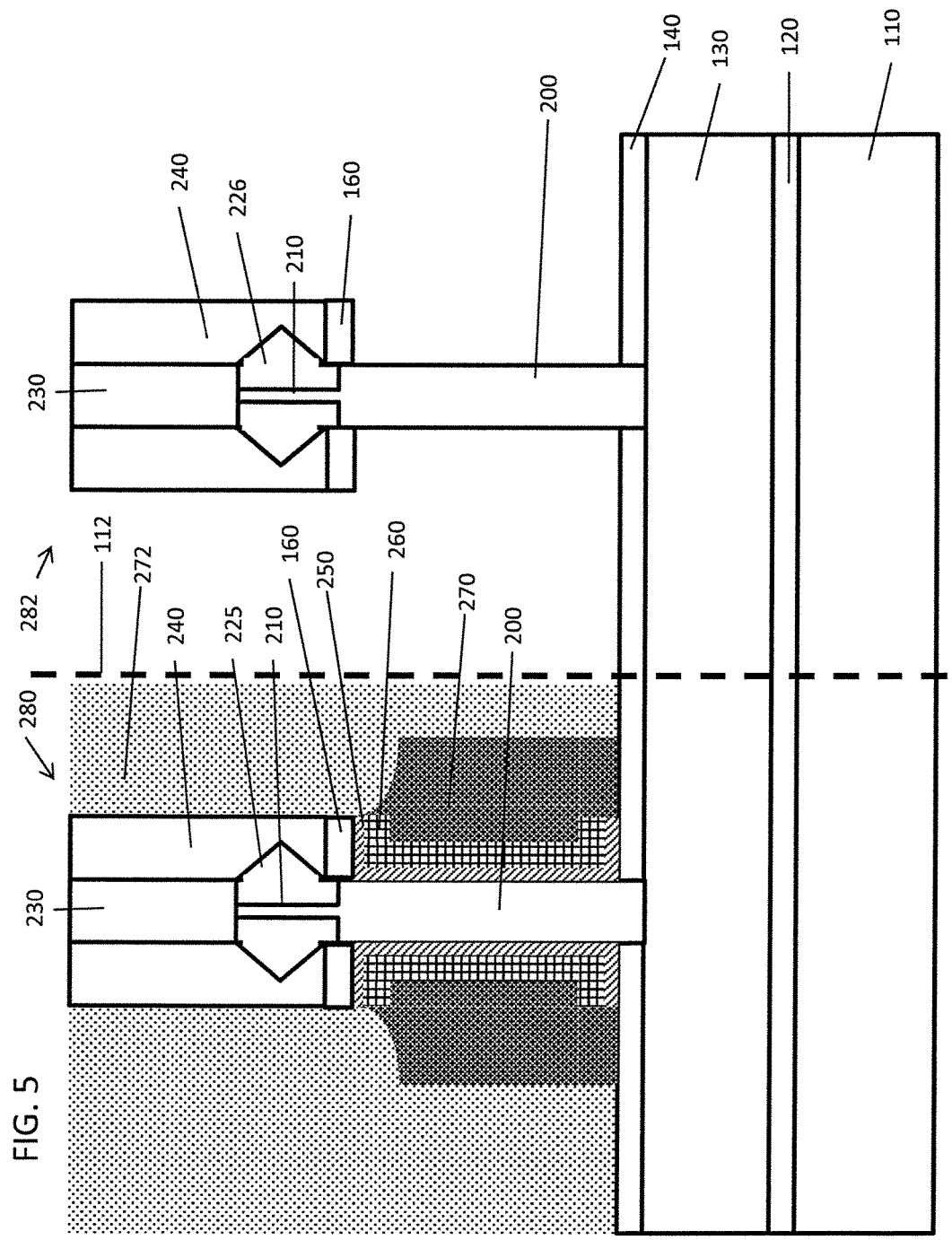
FIG. 5 is a cross-sectional view of the device in FIG. 4 showing a vertical transistor formed in a transistor region and a fin exposed in the fuse region in accordance with the present principles.

Referring to FIG. 5, the dummy layer liners 190 on the vertical fins 200 may be removed by a wet etch or RIE, where the wet etch or RIE may selectively remove silicon oxide. In one or more embodiments, a soft mask (not shown) may be formed on the e-fuse structure in areas 282 to protect the e-fuse structure during the removal of the dummy layer liners 190 and formation of gate dielectric layers, work function layers, and gate metal layers in area 280.

After removing dummy layer liners 190, a gate dielectric layer 250 may be formed on the vertical fin 200, bottom spacer layer 140, and dielectric material 240, where the gate dielectric layer 250 may be conformally deposited. The gate dielectric layer 250 may be conformally deposited by ALD and/or CVD. The gate dielectric layer 250 may be a high-k material, including but not limited to metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3}Nb_{2/3}O_3$). The high-k dielectric material may further include dopants such as lanthanum and/or aluminum. The stoichiometry of the high-k dielectric material may vary. In various embodiments, the gate dielectric layer 250 may have a thickness in the range of about 1.5 nm to about 2.5 nm.

In one or more embodiments, a work function layer 260 may be deposited over the gate dielectric layer 250, where the work function layer 260 may be conformally deposited by ALD and/or CVD. The work function layer 260 may be a nitride, including but not limited to titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC), tantalum carbide (TaC), hafnium carbide (HfC), and combinations thereof. The work function layer 260 may have a thickness in the range of about 1 nm to about 11 nm, or may have a thickness in the range of about 2 nm to about 5 nm.

In one or more embodiments, the work function layer 260 may include a thin a gate metal layer (not shown) which may be formed on the work function layer 160, where the gate metal layer may include a thin layer conformally deposited on the work function layer 260. A gate conductor 270 is deposited and patterned to form a gate electrode. The gate metal layer may be conformally deposited by ALD or CVD, where the gate metal layer may have a thickness in the range of about 5 Å to about 15 Å. The gate metal layer may be tungsten (W), aluminum (Al), titanium nitride (TiN), cobalt (Co), or a combination thereof. The total thickness of the gate metal layer and the work function layer 260 may be in the range of about 6 nm to about 12 nm. Unneeded metal(s) (for portions of gate metal layer, work function layer 260, and gate conductor 270) may be etched away. Portions of the high-k layer 250 may also be removed in defining the gate structure for each vertical fin 200. In various embodiments, the high-k layer 250, the gate conductor 270, and work function layer 260 may form a gate structure at least on opposite sides of the vertical fin 200. In various embodiments, the gate structure may wrap around three sides or four sides of the vertical fin.

In one or more embodiments, the gate dielectric layer 250, work function layer 260, the gate metal layer and gate conductor 270 may be removed from at least a portion of the bottom spacer layer 140 of the one or more vertical fins 200 to form a gate structure on the vertical fins 200. In various embodiments, each layer may be removed by a suitable directional etching process (e.g., RIE), where the underlying layer may act as an etch stop layer.

In one or more embodiments, the gate conductor 270 may be deposited on the gate metal layer or work function layer 250. In one or more embodiments, the gate conductor 270 may include tungsten (W). In various embodiments, the gate conductor 270 may extend laterally beyond the dielectric material 240 to allow formation of a metal contact to the gate structure. The gate conductor 270 may be electrically isolated from the heavily doped layer 130 by bottom spacer layer 140.

Space above the gate conductor 270 may be filled with a dielectric fill 272 to fill in the space between neighboring structures, including vertical devices, and provide electrical insulation between devices and components. In various embodiments, the soft mask may be removed from the area 282. The dielectric fill 272 may include an oxide, although other suitable dielectric, materials may be employed. After the soft mask is removed from area 282, the vertical fin in areas 282 is exposed by removing liner 190.

Figure 6:
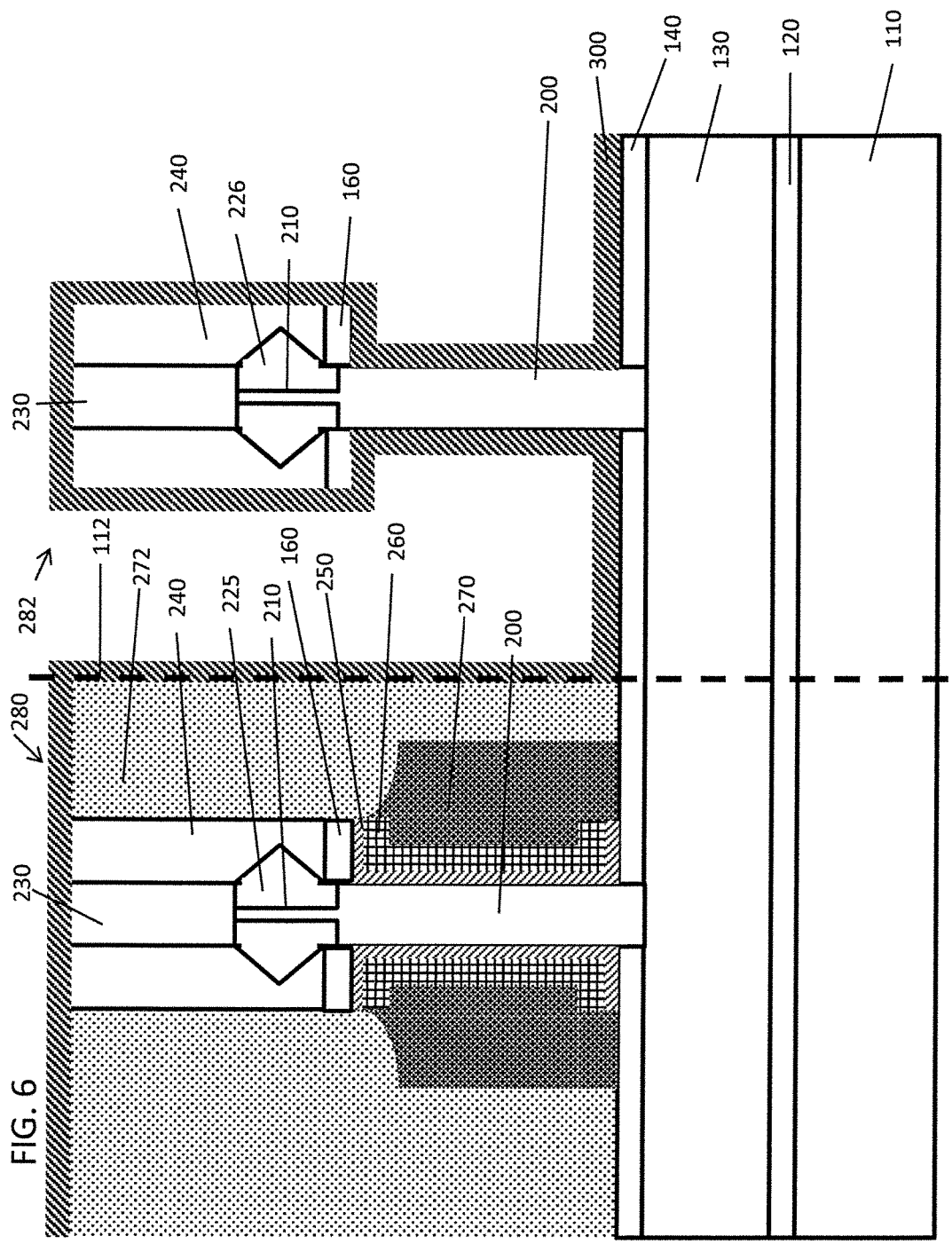
FIG. 6 is a cross-sectional view of the device in FIG. 5 showing a metal conformally formed and in contact with the fin exposed in the fuse region in accordance with the present principles.

Referring to FIG. 6, a metal layer 300 is conformally deposited over the entire device. The metal layer 300 may include Pt, Ni or other metals or combinations thereof. The metal layer 300 preferably includes a metal that forms a silicide with the vertical fin 200 in the area 282. The metal layer 300 forms on sidewalls of the vertical fins 200 in area 282, on bottom spacer layer 140 and over area 280. The metal layer 300 may be deposited by CVD, ALD or other suitable deposition processes. The metal layer 300 may include a thickness of between about 2 nm to about 20 nm. The metal layer 300 should provide an access of metal for the silicidation process to follow.

Figure 7:
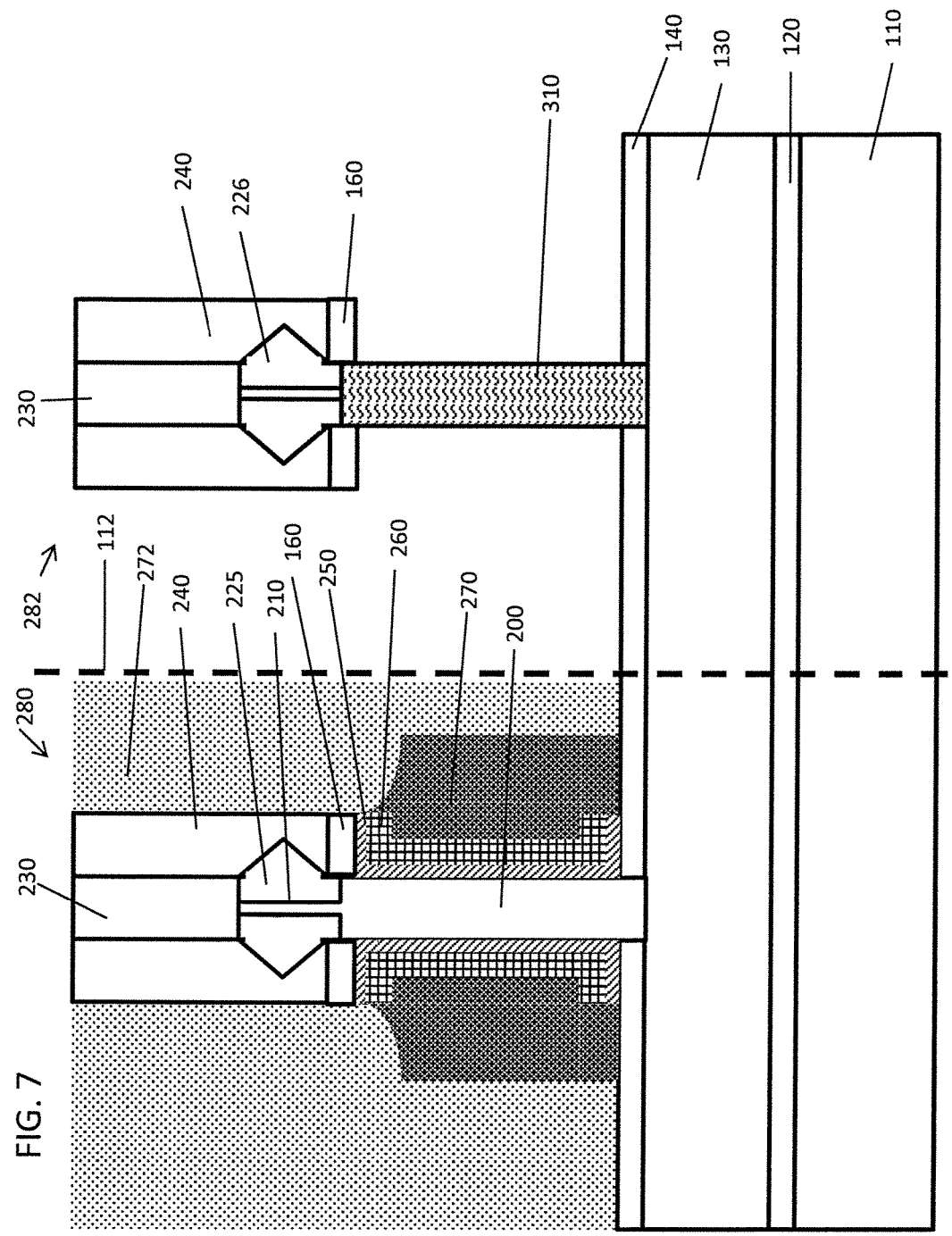
FIG. 7 is a cross-sectional view of the device in FIG. 6 showing the fin exposed in the fuse region silicided to form a fuse link in accordance with the present principles.

Referring to FIG. 7, an anneal process is performed to silicide the vertical fin 200 to form an e-fuse 310. The material of the vertical fin 200 in area 282 reacts with the metal deposited thereon in the metal layer 300 to form a metal silicide for the e-fuse 310. The silicidation process preferably fully consumes the Si in the fin 200 in area 282. The fin may include Si, SiGe, SiC, Ge, etc. The e-fuse 310 may be sized to adjust its performance parameters. These parameters are based on cross-sectional area of the e-fuse 310. Access metal (unreacted metal) from the metal layer 300 may be removed by a wet etch to other suitable etching process. An etching process may also be performed to adjust the dimensions of the e-fuse 310.

Figure 8:
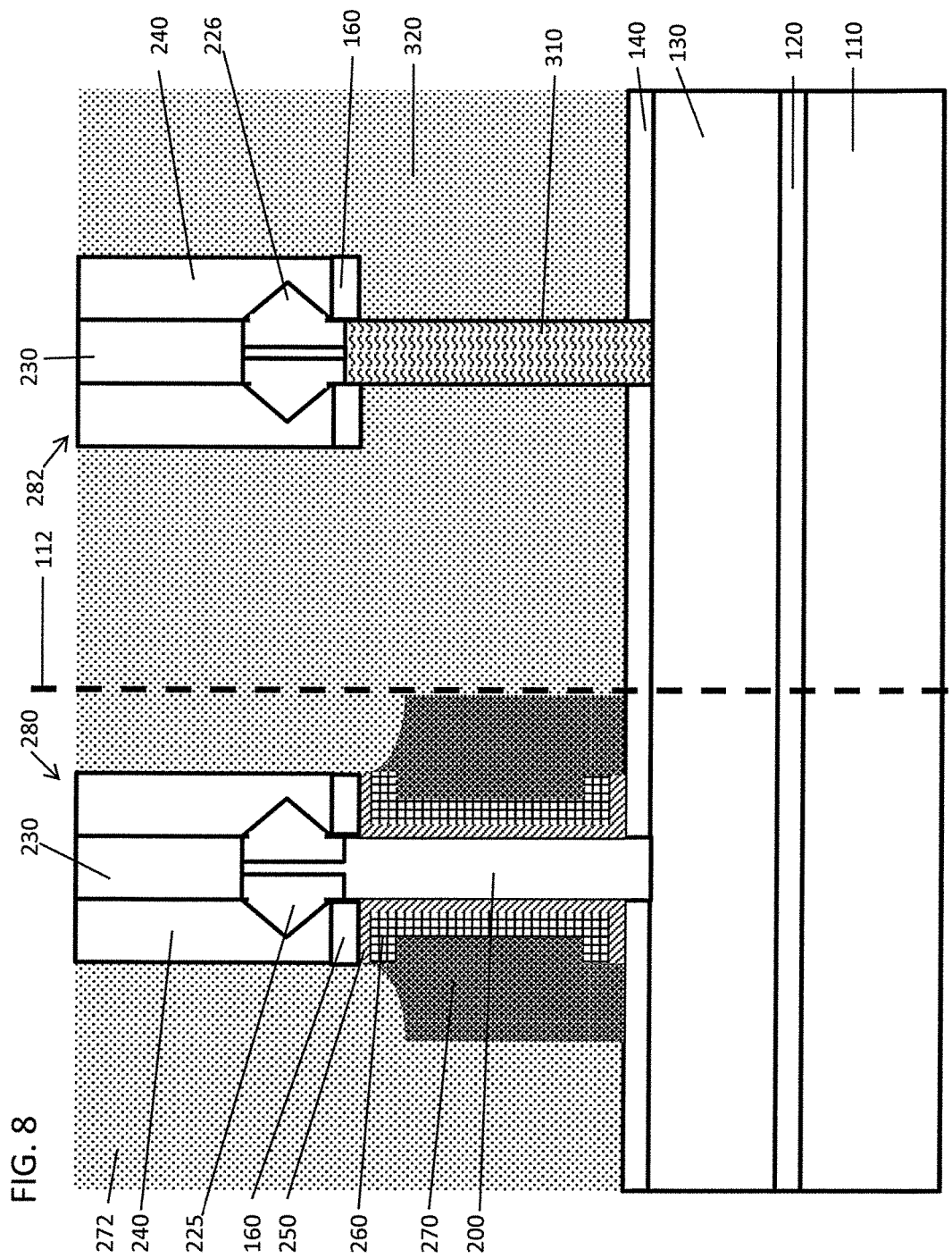
FIG. 8 is a cross-sectional view of the device in FIG. 7 showing an interlevel dielectric formed in accordance with the present principles.

Referring to FIG. 8, the area 282 is filled with an interlevel dielectric (ILD) 320 to fill in the space between neighboring structures, including e-fuses 310 and provide electrical insulation between devices and components. The ILD 320 may include an oxide or other suitable dielectric material.

Figure 9:
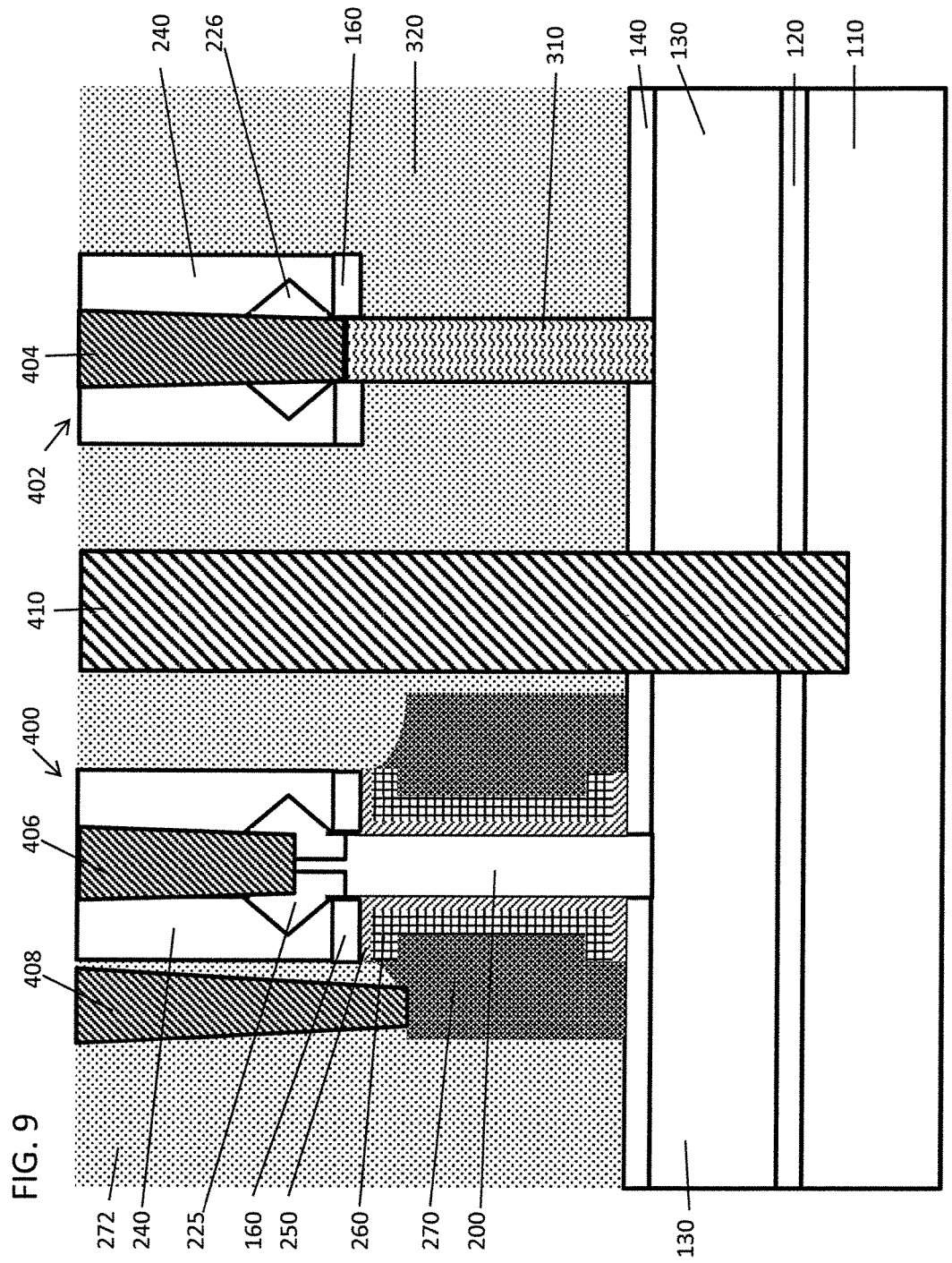
FIG. 9 is a cross-sectional view of the device in FIG. 8 showing contacts formed through the interlevel dielectric in accordance with the present principles.

Referring to FIG. 9, middle-of-line contacts 402, 404, 406 may be formed, where the gate, source and drain contacts may be made to the transistor components, and the anode/cathode contacts may be made to the e-fuse 310. One or more trenches may be formed in the dielectric 272 to form a contact hole that lands on the gate conductor 270. Source or anode contacts 406 and 404 may be self-aligned by removing fill 240 to form the contacts holes. The contact holes may extend vertically down through the gate conductor 270 to form metal contacts 408 for back end of line (BEOL) electrical connections to the gate structure(s).

In various embodiments, trenches may be etched vertically down through the dielectric material 240 to the top source/drain 225 to form metal contacts 406 for a vertical finFET 400. The cap or fill 240 may be removed to allow access to the top surface of the top source/drain 225. Trenches may be etched vertically down through the dielectric material 240 to the top anode/cathode 226 to form metal contacts 404 to the vertical diode. The cap or fill 240 may be removed to allow access to the top surface of the top anode/cathode 226.

In various embodiments, the trenches or contact holes may be filled with a barrier layer (not shown) and/or a metal contact fill. The barrier layer may be selectively formed in the contact holes to the top source/drain 225 and anode/cathode 226. The metal contact fill may be the same material as the gate conductor 270, and may be formed without an intervening barrier layer. In various embodiments, the metal contact fill may be a different material from the gate conductor 270, and an intervening barrier layer may be formed between the metal contact fill and the gate conductor 270 to avoid alloying and/or diffusion.

In one or more embodiments, a metal contact fill for contacts 402, 404, 406 may be tungsten (W), aluminum (Al), or copper (Cu). In various embodiments, the barrier layer may be titanium nitride (TiN), tantalum nitride (TaN), hafnium nitride (HfN), niobium nitride (NbN), tungsten nitride (WN), or combinations thereof, where the barrier layer may prevent diffusion and/or alloying of the metal contact fill material with the top source/drain material, anode/cathode material, and/or gate conductor 270. In various embodiments, the barrier layer may be conformally deposited in the trench(es) by ALD, CVD, MOCVD, PECVD, or combinations thereof. In various embodiments, the metal fill may be performed by ALD, CVD, and/or physical vapor deposition (PVD) to form the electrical contacts 404, 406, 408. The top surfaces of the metal contact fill for contacts 404, 406, 408 may be chemically-mechanically polished to provide a uniform surface.

In one or more embodiments, the vertical finFET 400 and vertical e-fuse 402 may have a shallow trench isolation (STI) region 410 dividing regions between these devices. The STI 410 may extend down to the substrate 110 through the heavily doped layer 130 and the counter-doped layer 120. The STI 410 may be employed to electrically isolate devices, e.g., into a plurality of heavily doped regions in the substrate to form a plurality of electrically separate bottom source/drains and bottom anode/cathodes to provide electrical isolation. In various embodiments, the STI 410 is filled with a silicon oxide.

The vertical finFET 400 includes vertical fin 200, which forms a channel between the bottom source/drain 130 for the vertical finFET 400 and top source/drain region 225. The vertical e-fuse 402 includes the e-fuse 310, which forms a fuse link between the bottom anode/cathode 130 for the vertical e-fuse 402 and top anode/cathode region 226. In some embodiments, the top source/drain and bottom source/drain may be n-doped or p-doped. The top source/drain and bottom source/drain also may be interchanged. In some embodiments, the top anode/cathode and bottom anode/cathode may be n-doped or p-doped. The top anode/cathode and bottom anode/cathode also may be interchanged.

In useful embodiments, the e-fuse 402 and vertical finFET 400 may be fabricated adjacent to each other on the same substrate 110, where the heavily doped region 130 below the vertical finFET 400 may be separated from the heavily doped region 130 below the e-fuse 402 by the STI region 410. In one embodiment, the electrical contacts of the vertical finFET 400 and the e-fuse 402 may be electrically isolated from each other or may be electrically connected to each other. The e-fuse 402 may be programmed using a laser, increased current or mechanical methods to program the fuse or fuses to perform a particular function. The channel formed by the vertical transistor fin and the link formed by the vertical fuse fin may include an equivalent height (e.g., same fin heights).

Figure 10:
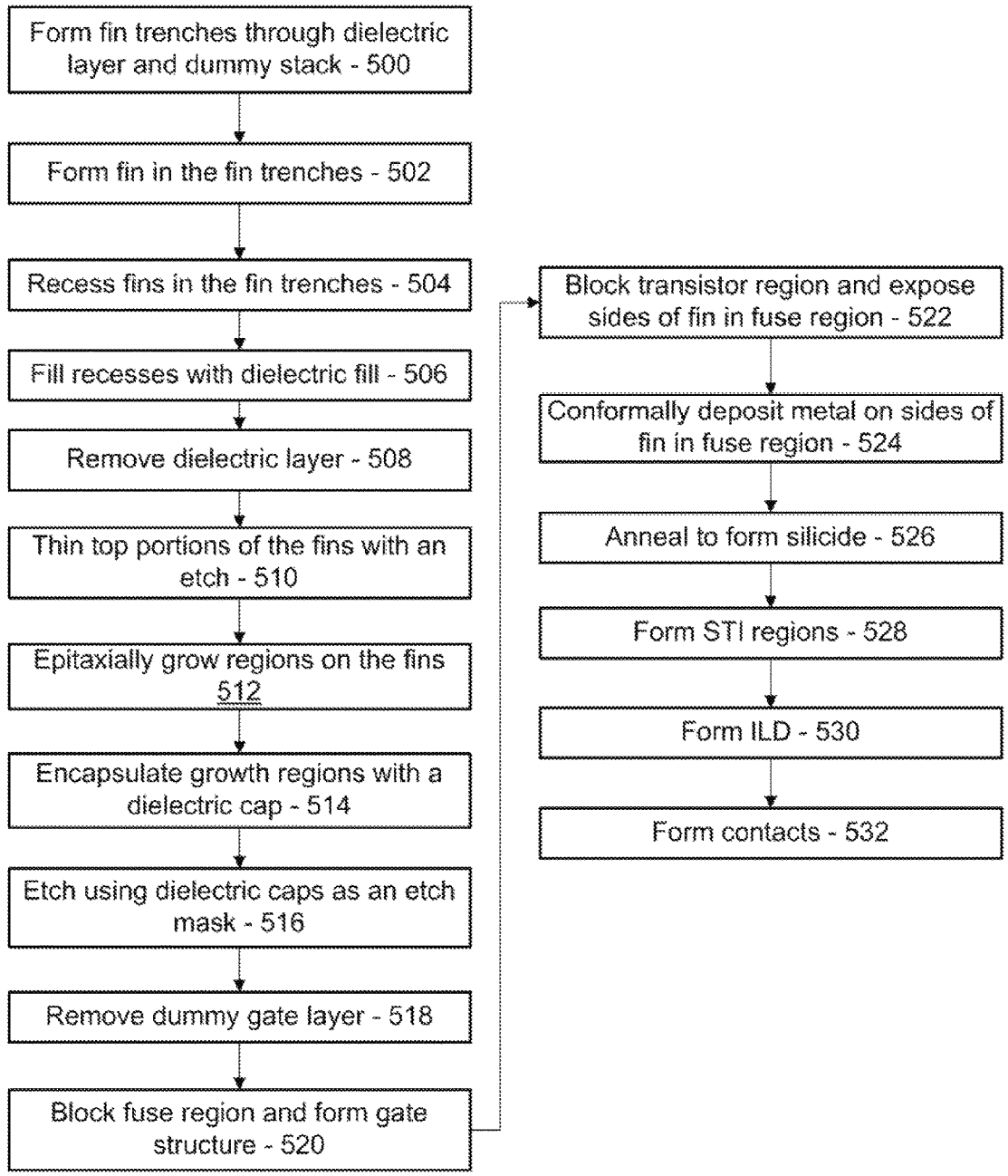
FIG. 10 is a block/diagram showing methods for forming a semiconductor device with vertical transistors and vertical fuses co-integrated in accordance with the present principles.

Referring to FIG. 10, a method for co-integration of vertical transistors and vertical fuses is shown in accordance with the present principles. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 500, a dummy gate stack and a dielectric layer are formed on a substrate and patterned to form fin trenches. The dummy stack may include amorphous silicon that may be oxidized in the fin trenches to permit removal of a dummy gate layer in subsequent steps. In block 502, fins are formed through a dielectric layer and a dummy gate stack on a substrate, the dummy gate stack including a bottom spacer, a dummy gate layer and a top spacer layer. The fins may be formed through the dummy gate stack on the substrate by epitaxially growing the fins from the substrate through fin trenches formed through the dielectric layer and dummy stack.

In block 504, the fins are recessed down into the dielectric layer. In block 506, recesses above the fins are filled with a dielectric fill. In block 508, the dielectric layer is removed. In block 510, top portions of the fins are thinned by an etch process. In block 512, top source/drain regions are epitaxially grown on thinned portions of the fins in a transistor region, and top cathode/anode regions are epitaxially grown on the thinned portions of the fins in a fuse region. In block 514, the source/drain regions and cathode/anode regions are encapsulated with a dielectric cap down to the top spacer layer. In block 516, the dielectric caps are employed as an etch mask for etching materials around the fins to expose the bottom spacer layer.

In block 518, the dummy gate layer is removed and sidewalls of the fins are exposed. In block 520, the fuse region is blocked to form a gate structure in the transistor region. In block 522, the transistor region is blocked, and the fuse region is exposed. In block 524, a metal is conformally deposited on exposed sidewalls of the fins in the fuse region. In block 526, the metal is annealed to form silicided fins, which form fuses in the fuse region. In block 528, portions of the substrate are separated to form bottom source/drain regions for vertical transistors in the transistor region and bottom cathode/anode regions for fuses in the fuse region. Portions of the substrate are separated by etching trenches between the transistor region and the fuse region to form a shallow trench isolation region in the trenches.

In block 530, the dielectric fill may be removed to form contact holes. In block 532, the contact holes may be filled to form contacts to the bottom source/drain regions and the bottom cathode/anode regions, and a gate contact may be formed that lands on the gate conductor through an interlevel dielectric layer formed on the vertical transistors.

Having described preferred embodiments for high density programmable e-fuse co-integrated with vertical FETs (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device, comprising:
    a doped portion of a substrate being separated by a shallow trench isolation region to form a bottom source/drain region in a transistor region and bottom cathode/anode region in a fuse region;
    a vertical transistor, including:
        a first fin having a bottom portion formed on the bottom source/drain region in the transistor region and forming a vertical channel for the vertical transistor;
        a gate structure formed on an intermediary portion of the first fin in the transistor region; and
        a top source/drain region grown on a narrower top portion of the first fin; and
    an electrical fuse co-integrated with the vertical transistor, including:
        a vertical silicided link formed from an intermediary portion of a second fin disposed on the bottom cathode/anode region in the fuse region; and
        a top cathode/anode region coupled to the link on a top portion of the second fin opposite to the bottom cathode/anode region relative to the link in the fuse region.

2. The device as recited in claim 1, wherein the channel formed by the first fin and the link formed by the second fin have an equivalent height.

3. The device as recited in claim 1, further comprising:
    a dielectric fill formed over the vertical transistor and the electrical fuse and having contacts connected to the bottom source/drain region and the bottom cathode/anode region.

4. The device as recited in claim 1, wherein the gate structure includes a gate dielectric and a vertically disposed gate conductor; and a gate contact is configured to land on the gate conductor.

5. The device as recited in claim 1, wherein the intermediary portion of the first fin is between the thinned portion and the bottom source/drain region in the transistor region.

6. The device as recited in claim 1, wherein the doped portion of the substrate includes a doped layer formed on a counter doped layer.

7. The device as recited in claim 1, wherein the top source/drain region has a crystal orientation that is the same as a crystal orientation of the thinned portion of the first fin.

8. The device as recited in claim 1, wherein the vertical transistor and the electrical fuse are formed within an interlevel dielectric (ILD).

* * * * *